US008832623B1

(12) United States Patent
Yuan et al.

(10) Patent No.: US 8,832,623 B1
(45) Date of Patent: Sep. 9, 2014

(54) UNIVERSAL DESIGN LAYOUT COMPLIANCE

(71) Applicant: Taiwan Semiconductor Manfacturing Company Limited, Hsin-Chu (TW)

(72) Inventors: Min-Shueh Yuan, Taipei (TW); Chao-Chieh Li, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/852,080

(22) Filed: Mar. 28, 2013

Related U.S. Application Data

(60) Provisional application No. 61/801,076, filed on Mar. 15, 2013.

(51) Int. Cl.
  *G06F 17/50* (2006.01)
(52) U.S. Cl.
  CPC .................................. *G06F 17/5081* (2013.01)
  USPC ........................................................ 716/112
(58) Field of Classification Search
  USPC ........................................................ 716/112
  See application file for complete search history.

(56) References Cited

U.S. PATENT DOCUMENTS

| | | | |
|---|---|---|---|
| 2004/0064795 A1* | 4/2004 | Li et al. ............................... | 716/5 |
| 2005/0076316 A1* | 4/2005 | Pierrat et al. ....................... | 716/4 |
| 2005/0132306 A1* | 6/2005 | Smith et al. ........................ | 716/1 |
| 2008/0120586 A1* | 5/2008 | Hoerold ............................. | 716/9 |
| 2009/0031261 A1* | 1/2009 | Smith et al. ........................ | 716/2 |

OTHER PUBLICATIONS

"Design Rule Checking", http://en.wikipedia.org/wiki/Design_rule_checking, pp. 1-3, Sep. 13, 2006.

* cited by examiner

*Primary Examiner* — Thuan Do
*Assistant Examiner* — Mohammed Alam
(74) *Attorney, Agent, or Firm* — Cooper Legal Group, LLC

(57) ABSTRACT

Among other things, one or more techniques and systems for generating a common design rule check (DRC) rule set for verification of a design layout and for generating a common dummy insertion utility for design layout processing are provided. That is, the common DRC rule set comprises a set of design rules having design rule constraint values corresponding to a restriction threshold, such as a most restrictive value. The common dummy insertion utility is used to insert dummy polygons into a design layout according to a dummy size constraint and a dummy spacing constraint. The design layout is verified as compliant with the common DRC rule set. Once verified, the design layout can be converted from a universal design layout format to a target metal scheme to create a transformed design layout. In this way, design layouts, formatted according to the universal design layout, can be transformed to other formats.

20 Claims, 9 Drawing Sheets

300

302

METAL SCHEME (1) DRC RULE SET

- SPACING CONSTRAINT: 0.09
- WIDTH CONSTRAINT: 0.2
- VIA SIZE CONSTRAINT: 2
- ENCLOSURE CONSTRAINT: 1
- DUMMY SPACING CONSTRAINT: 0.2
- DUMMY SIZE CONSTRAINT: 0.4
- ...

304

METAL SCHEME (2) DRC RULE SET

- SPACING CONSTRAINT: 0.1
- WIDTH CONSTRAINT: 0.2
- VIA SIZE CONSTRAINT: 3.2
- ENCLOSURE CONSTRAINT: 1.2
- DUMMY SPACING CONSTRAINT: 1.2
- DUMMY SIZE CONSTRAINT: 0.7
- ...

•
•
•

306

METAL SCHEME (N) DRC RULE SET

- SPACING CONSTRAINT: 0.12
- WIDTH CONSTRAINT: 0.23
- VIA SIZE CONSTRAINT: 1.2
- ENCLOSURE CONSTRAINT: 0.8
- DUMMY SPACING CONSTRAINT: 0.3
- DUMMY SIZE CONSTRAINT: 1.5
- ...

FIG. 3

UNIVERSAL DESIGN LAYOUT COMPLIANCE

BACKGROUND

Electronic design tools allow designers to layout, simulate, and analyze electrical components, such as integrated circuits. For example, a design layout can comprise one or more polygons representing metal structures, such as metal lines, vias, or other structures. The design layout can comprise one or more layers that are generated based upon metal schemes. For example, a first metal layer can be formed according to a first metal scheme having a first design rule check (DRC) rule set specifying various design rules, such as a minimum spacing constraint between polygons, a minimum width constraint of a polygon, an enclosure constraint where a first polygon is enclosed by a second polygon, or a variety of other design rules. Because various designers can use different metal schemes for design layouts (e.g., a first designer specifies a second metal scheme for a second metal layer and a third metal scheme for a third metal layer of a first design layout, whereas a second designer specifies a fourth metal scheme for a second metal layer and a fifth metal scheme for a third metal layer of a second design layout), a fabricator has to maintain a relatively large set of metal schemes.

SUMMARY

This summary is provided to introduce a selection of concepts in a simplified form that are further described below in the detailed description. This summary is not intended to identify key factors or essential features of the claimed subject matter, nor is it intended to be used to limit the scope of the claimed subject matter.

One or more systems and techniques for generating a common design rule check (DRC) rule set for verification of a design layout and for generating a common dummy insertion utility are provided herein. In some embodiments of generating a common DRC rule set, a set of design rules are derived from one or more DRC rule sets associated with metal schemes. For example, a first metal scheme is associated with a first DRC rule set, a second metal scheme is associated with a second DRC rule set, a third metal scheme is associated with a third DRC rule set, etc. A DRC rule set comprises one or more design rules, such as a spacing constraint, a width constraint, a via size constraint, an enclosure constraint, etc. In an example, DRC rule sets can have differing design rule constraint values for design constraints. For example, a first DRC rule set specifies a 0.2 width constraint where a polygon is to have a width of at least 0.2 units, while a second DRC rule set specifies a 0.4 width constraint where a polygon is to have a width of at least 0.4 units. Satisfaction of the first DRC rule set does not necessarily mean satisfaction of the second DRC rule set, such as a polygon having a width of 0.3 units. However, satisfaction of the second DRC rule set will satisfy the first DRC rule set, such as a polygon having a width of 0.8 units.

For respective design rules within the set of design rules, one or more DRC rule sets are evaluated to identify a design rule constraint value for a design rule based upon the design rule constraint value corresponding to a restriction threshold. In some embodiments, the restriction threshold specifies that a first design rule constraint value is to be selected over a second design rule constraint value because the first design rule constraint value is relatively more restrictive. For example, the 0.4 width constraint is relatively more restrictive than the 0.2 width constraint because a width that satisfies the 0.4 width constraint, such as a polygon having a width of 0.6, will satisfy the 0.2 width constraint. The design rule constraint value is assigned to the design rule for inclusion within the common DRC rule set. In this way, the common DRC rule set comprises a set of design rules that will satisfy the one or more DRC rule sets associated with the metal schemes. Thus, a design layout can be verified as being compliant with the common DRC rule set and/or a DRC rule set associated with a metal scheme assigned for the design layout.

In some embodiments, a dummy insertion utility is generated based upon the one or more DRC rule sets. The dummy insertion utility comprises a dummy size constraint having a dummy size constraint value corresponding to a dummy size restriction threshold, such as a largest dummy size constraint value out of the one or more DRC rule sets. The dummy insertion utility comprises a dummy spacing constraint having a dummy spacing constraint value corresponding to a dummy spacing restriction threshold, such as a largest dummy spacing constraint value out of the one or more DRC rule sets. It may be appreciated that the dummy insertion utility may comprise other constraints. Accordingly, the instant application, including the scope of the appended claims, is not limited to the examples provided herein. In this way, the dummy insertion utility can insert one or more dummy polygons into the design layout to generate a filled design layout that will satisfy the one or more DRC rule sets and the common DRC rule set.

In some embodiments, the design layout or the filled design layout can be transformed from a universal design layout format, corresponding to the common DRC rule set and a metal scheme rule set of the universal design layout format, to a transformed design layout according to a target metal scheme. For example, a DRC component creates a universal design layout from a design layout based upon a metal scheme for the universal design layout format. The DRC component verifies that the universal design layout is compliant with a common DRC rule set and/or a DRC rule set for the metal scheme of the universal design layout format. A common dummy insertion utility inserts one or more dummy polygons into the universal design layout to create a filled universal design layout. The DRC component verifies that the filled universal design layout is compliant with the DRC rule set for the metal scheme and/or the common DRC rule set. A transformation component transforms the filled universal design layout into a transformed design layout according to a target metal scheme. The DRC component verifies that the transformed design layout is compliant with the common DRC rule set and/or a DRC rule set for the target metal scheme. In this way, the design layout is transformed into the transformed design layout.

The following description and annexed drawings set forth certain illustrative aspects and implementations. These are indicative of but a few of the various ways in which one or more aspects can be employed. Other aspects, advantages, and novel features of the disclosure will become apparent from the following detailed description when considered in conjunction with the annexed drawings.

DESCRIPTION OF THE DRAWINGS

FIG. 3 is an illustration of one or more DRC rule sets, according to some embodiments.

DETAILED DESCRIPTION

Figure 1:
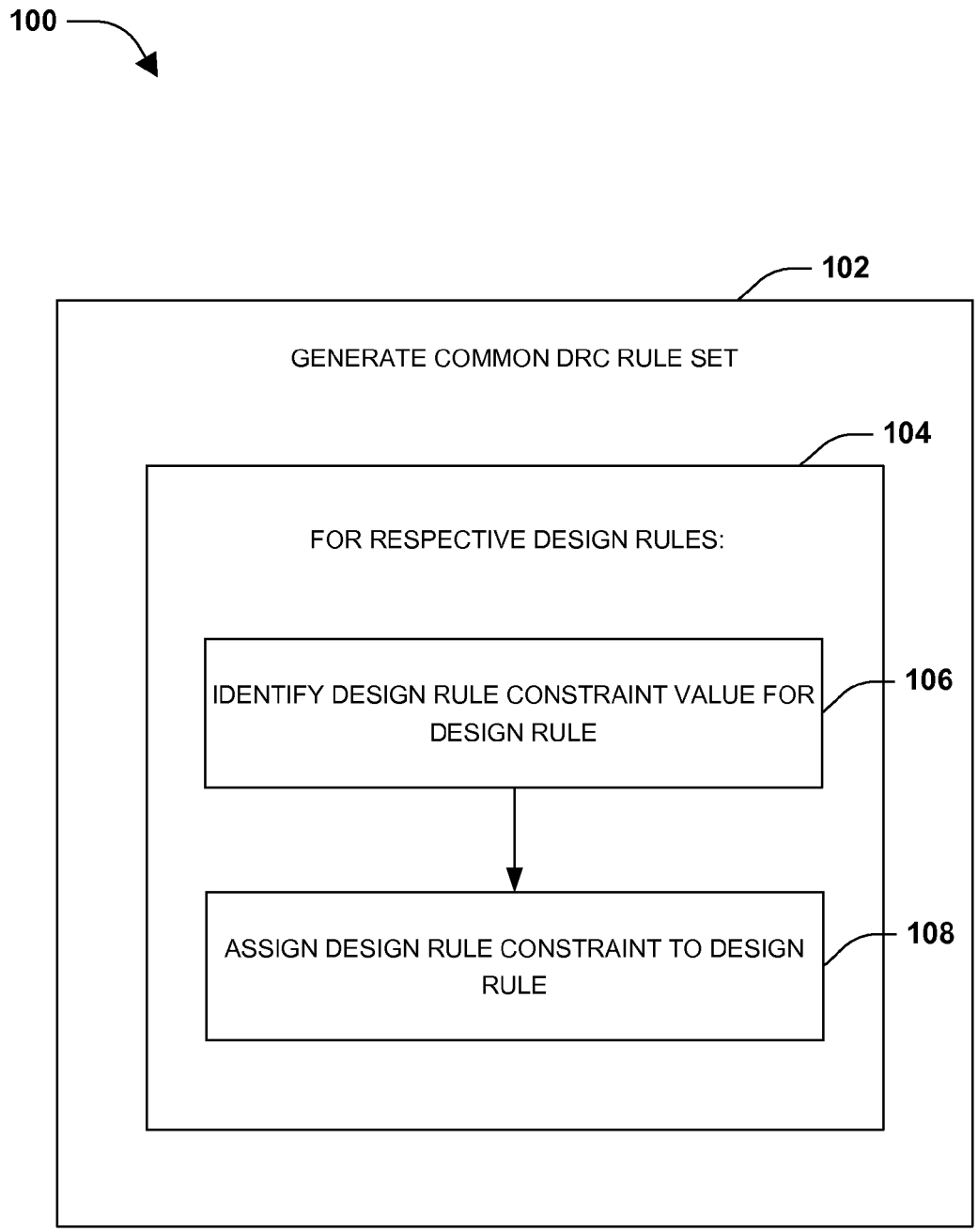
FIG. 1 is a flow diagram illustrating a method of generating a common design rule check (DRC) rule set for verification of a design layout, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

A method 100 of generating a common design rule check (DRC) rule set for verification of a design layout, according to some embodiments, is illustrated in FIG. 1. A design layout comprises one or more polygons representing metal structures, such as metal lines, vias, or other structures. The design layout comprises one or more layers, such as a first metal layer, a second metal layer, or other metal layers that are constructed based upon one or more metal schemes. For example, a first metal layer is assigned to a first metal scheme, a second metal layer is assigned to the first metal scheme, a third metal layer is assigned to a second metal scheme, a fourth metal layer is assigned to the first metal scheme, etc. Because numerous metal schemes or combinations thereof can be used for different design layouts and various layers of such design layouts, a universal design layout, capable of satisfying DRC rule sets for the metal schemes, can be used to generate a design layout that will satisfy a common DRC rule set derived from the DRC rule sets for the metal schemes. For example, a design layout that satisfies the common DRC rule set will satisfy the DRC rule sets because the common DRC rule set is based upon design rule constraint values corresponding to a restriction threshold, such as a most restrictive design constraint value from the DRC rule sets.

At 102, the common DRC rule set is generated. The common DRC rule set comprises a set of design rules derived from one or more DRC rule sets associated with metal schemes. One or more DRC rule sets are illustrated by example 300 in FIG. 3. A DRC rule set comprises one or more design rules, such as a spacing constraint specifying a minimum spacing between polygons, a width constraint specifying a minimum width for a polygon, a via size constraint specifying a minimum size for a via, an enclosure constraint, a dummy spacing constraint for a dummy polygon, a dummy size constraint for a dummy polygon, or other constraints not illustrated. A first DRC rule set 302 for a first metal scheme comprises design rule constraint values for one or more design rules, such as 0.09 for the spacing constraint, 0.2 for the width constraint, 2 for the via size constraint, 1 for the enclosure constraint, 0.2 for a dummy spacing constraint, 0.4 for the dummy size constraint, etc. A second DRC rule set 304 for a second metal scheme comprises design rule constraint values for the one or more design rules. Other DRC rule sets, such as a DRC rule set 306, can be associated with other metal schemes. The common DRC rule set can be derived from the one or more DRC rule sets. In an example, relatively more restrictive design rule constraint values are selected over relatively less restrictive design rule constraint values. For example, a spacing constraint value of 0.12 within the DRC rule set 306 is selected over the spacing constraint value of 0.09 within the first DRC rule set 302 and a spacing constraint value of 0.1 within the second DRC rule set 304. In this way, satisfaction of the spacing constraint value of 0.12 within the common DRC rule set will satisfy the spacing constraint within the first DRC rule set 302, the second DRC rule set 304, and the DRC rule set 306.

At 104, for respective design rules within the set of design rules, one or more DRC rule sets are evaluated to identify a design rule constraint value for a design rule, at 106. The design rule constraint value is identified based upon the design rule constraint value corresponding to a restriction threshold. In some embodiments, the restriction threshold specifies that a first design rule constraint value is selected over a second design rule constraint value based upon the first design rule constraint value being relatively more restrictive. For example, a via size constraint value of 3.2 within the second DRC rule set 304 is selected over a via size constraint value of 2 within the first DRC rule set 302 and a via size constraint value of 1.2 within the DRC rule set 306 (e.g., the via size constraint specifies a minimum size for a via, such that a larger value is more restrictive). At 108, the design rule constraint value is assigned to the design rule for inclusion within the common DRC rule set. In this way, a design layout that satisfies the common DRC rule set will also satisfy the DRC rule sets. For example, a design layout that can satisfy the via size constraint value of 3.2, specified within the common DRC rule set, will satisfy the via size constraint of 2 within the first DRC rule set 302, the via size constraint of 3.2 within the second DRC rule set 304, and the via size constraint of 1.2 within the DRC rule set 306. It is appreciated that other constraints can be identified for inclusion within the common DRC rule set and that merely a few are illustrated for simplicity, and thus the instant application is not to be limited by illustrated examples.

In some embodiments, a universal design layout format is specified based upon the common DRC rule set. A design layout can be identified as being compliant with the universal design layout format based upon the design layout satisfying (e.g., being compliant with) the common DRC rule set. In an example, one or more metal schemes are assigned to the design layout, such as a first metal scheme being assigned to a first metal layer, a second metal scheme being assigned to a second metal layer, etc. The design layout can be verified as being compliant with a DRC rule set associated with a metal scheme assigned for the design layout.

In some embodiments, the design layout can be transformed into a transformed design layout. That is, responsive to the design layout being compliant with the universal design layout format where the design layout satisfied the common DRC rule set, the design layout is transformed from the universal design layout format to a target metal scheme to create the transformed design layout. Because the design layout satisfied the common DRC rule set having relatively restrictive design rule constraints, the design layout will satisfy a target DRC rule set of the target metal scheme. The transformed design layout can be simulated. For example, RC extraction, electro-migration (EM) analysis, voltage (IR) drop analysis, or other simulations can be performed.

Figure 2:
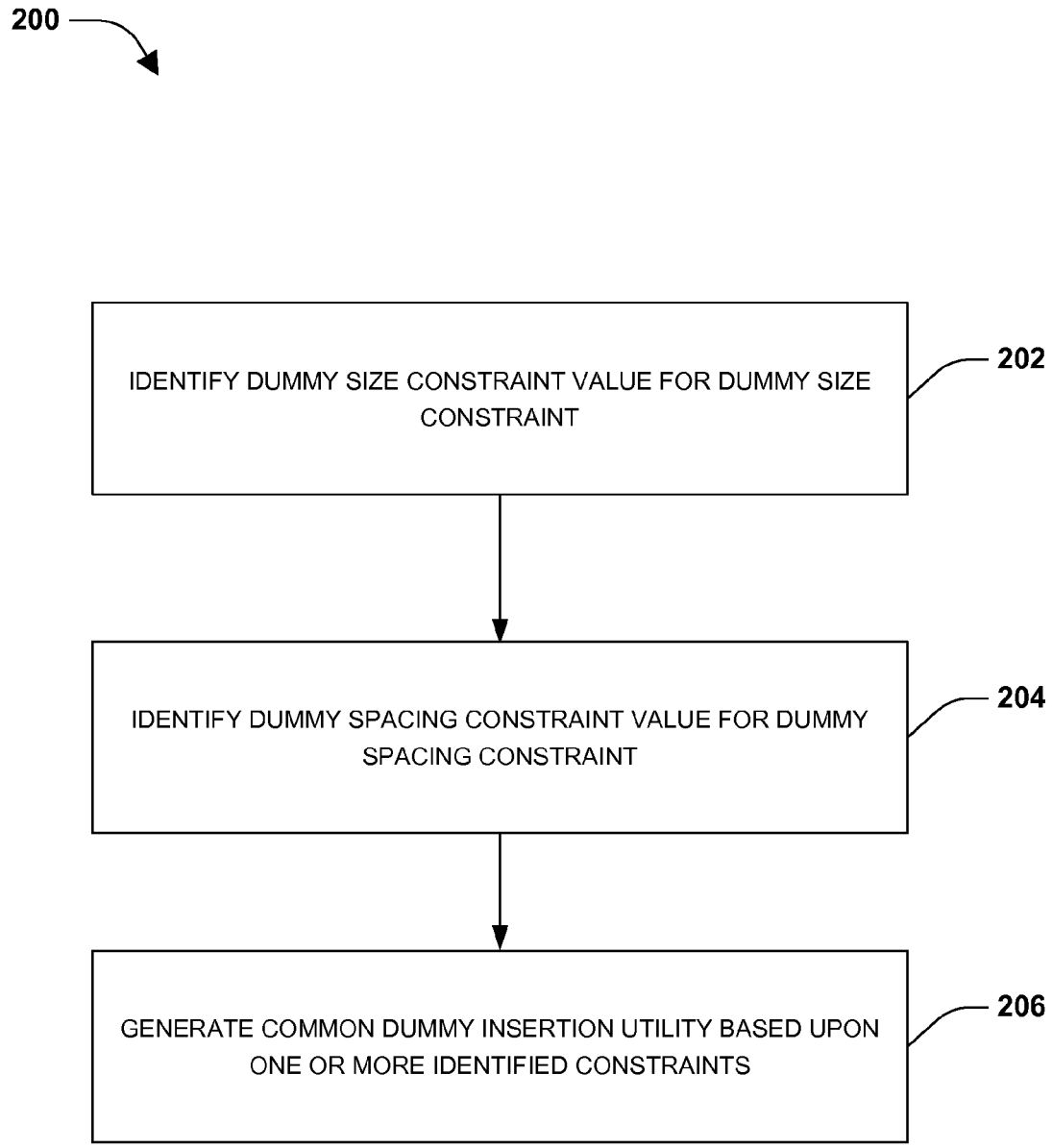
FIG. 2 is a flow diagram illustrating a method of generating a common dummy insertion utility for design layout processing, according to some embodiments.

A method 200 of generating a common dummy insertion utility for processing a design layout, according to some embodiments, is illustrated in FIG. 2. The common dummy insertion utility is used to insert one or more dummy polygons into a design layout. In an example, the one or more dummy polygons are inserted to satisfy a metal density rule. At 202, one or more DRC rule sets are evaluated to identify a dummy size constraint value for a dummy size constraint specifying a minimum dummy polygon size for a dummy polygon. The dummy size constraint value is identified based upon the dummy size constraint value corresponding to a dummy size restriction threshold. In some embodiments, the dummy size restriction threshold specifies that a first dummy size constraint value is selected over a second dummy size constraint value based upon the first dummy size constraint value being relatively more restrictive. For example, a dummy size constraint value of 1.5 of the DRC rule set 306 is selected over the dummy size constraint 0.4 of the first DRC rule set 302 and the dummy size constraint 0.7 of the second DRC rule set 304.

At 204, one or more DRC rule sets are evaluated to identify a dummy spacing constraint value for a dummy spacing constraint specifying a minimum spacing around a dummy polygon. The dummy spacing constraint value is identified based upon the dummy spacing constraint value corresponding to a dummy spacing restriction threshold. In some embodiments, the dummy spacing restriction threshold specifies that a first dummy spacing constraint value is selected over a second dummy spacing constraint value based upon the first dummy spacing constraint value being relatively more restrictive. For example, the dummy spacing constraint of 1.2 within the second DRC rule set 304 is selected over the dummy spacing constraint of 0.2 of the first DRC rule set 302 and the dummy spacing constraint of 0.3 of the DRC rule set 306. In some embodiments, one or more additional constraints are identified for inclusion within the common dummy insertion utility.

At 206, the common dummy insertion utility is generated based upon one or more identified constrains, such as the dummy size constraint having the dummy size constraint value and the dummy spacing constraint having the dummy spacing constraint value. It is appreciated that other constraints can be identified for inclusion within the dummy insertion utility and that merely a few are illustrated for simplicity, and thus the instant application is not to be limited by illustrated examples. Because the common dummy insertion utility is generated based upon relatively more restrictive constraint values, a design layout processed using the common dummy insertion utility will satisfy dummy placement constraints, such as dummy size constraints, dummy spacing constraints, etc., of DRC rule sets for metal schemes.

In some embodiments, the common dummy insertion utility is used to insert one or more dummy polygons into a design layout to generate a filled design layout. For example, a first dummy polygon is inserted into the design layout, such that the first dummy polygon satisfies the dummy size constraint and the dummy spacing constraint. In some embodiments, the filled design layout is verified as compliant with the common DRC rule set. In some embodiments, the filled design layout is verified as compliant with a DRC rule set associated with a metal scheme assigned for the design layout. In some embodiments, the filled design layout is transformed from a universal design layout format to a target metal scheme to create a transformed design layout.

Figure 4:
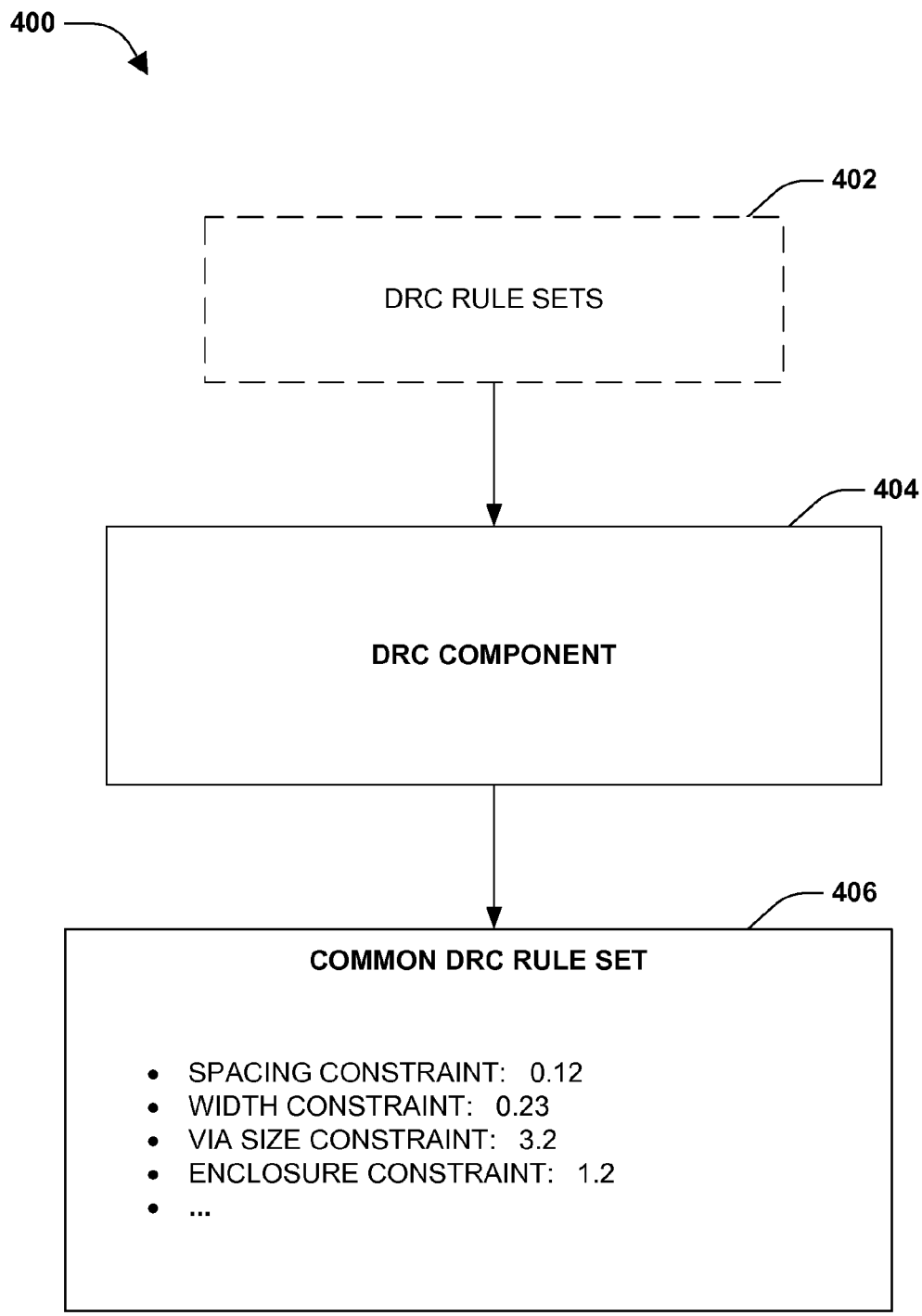
FIG. 4 is an illustration of a system configured for generating a common DRC rule set for verification of a design layout, according to some embodiments.

FIG. 4 illustrates a system 400 for generating a common DRC rule set 406, according to some embodiments. The system 400 comprises a DRC component 404. The DRC component 404 is configured to evaluate one or more DRC rule sets 402, such as the first DRC rule set 302, the second DRC rule set 304, and the DRC rule set 306 of FIG. 3. The DRC component 404 may identify a set of design rules for inclusion within the common DRC rule set, such as a spacing constraint, a width constraint, a via size constraint, an enclosure constraint, or specific constraints for metal schemes, etc. The DRC component 404 assigns a spacing constraint value of 0.12 within the DRC rule set 306 to the spacing constraint within the common DRC rule set 406 because the spacing constraint value of 0.12 is relatively more restrictive than the spacing constraint value of 0.09 within the first DRC rule set 302 and the spacing constraint value of 0.1 within the second DRC rule set 304. The DRC component 404 assigns a width constraint value of 0.23 within the DRC rule set 306 to the width constraint within the common DRC rule set 406 because the width constraint value of 0.23 is relatively more restrictive than the width constraint value of 0.2 within the first DRC rule set 302 and the width constraint value of 0.2 within the second DRC rule set 304. In this way, the DRC component 404 is configured to assign design rule constraint values, corresponding to a restriction threshold such as a most restrictive value, to constraints within the common DRC rule set 406.

Figure 5:
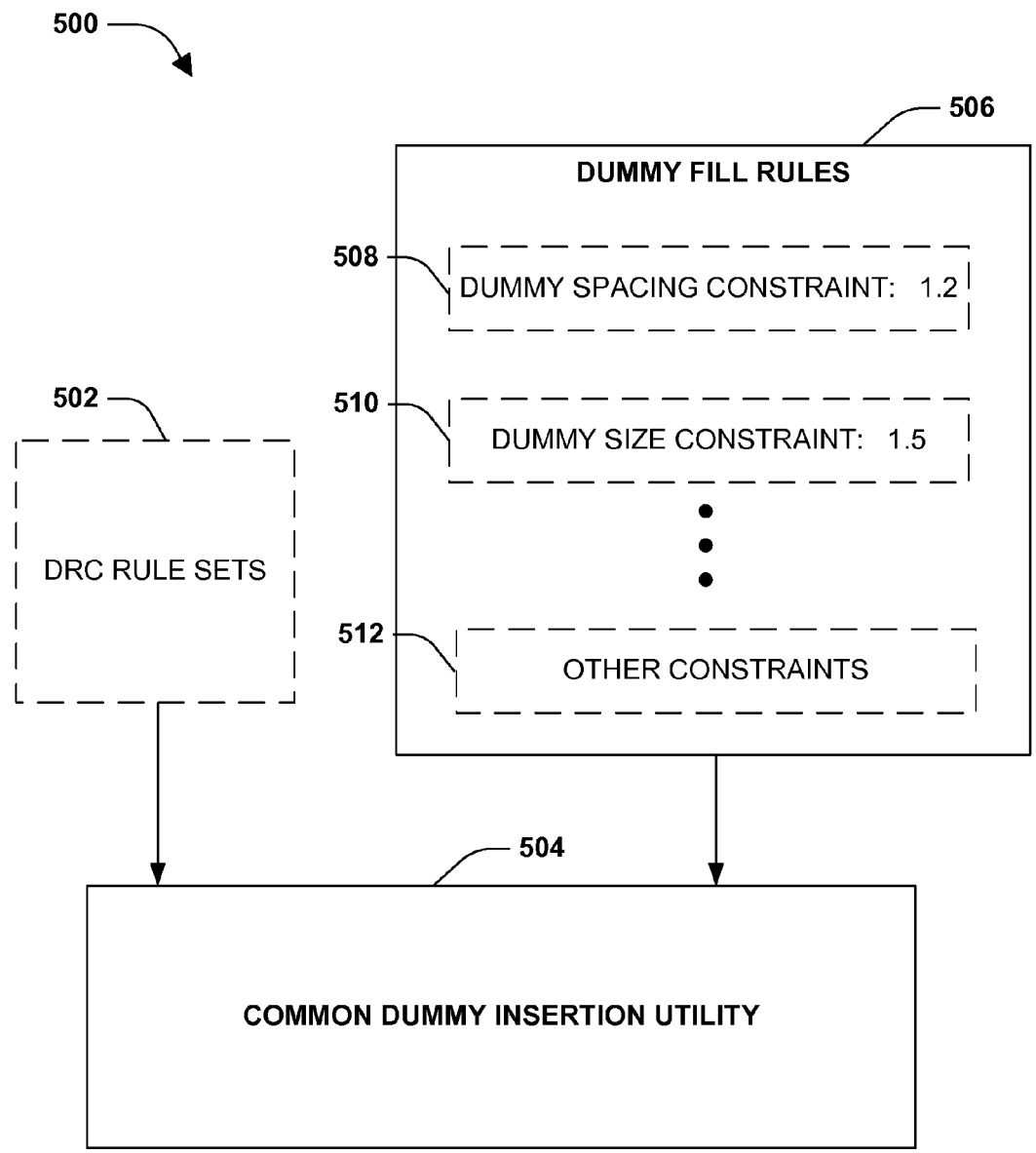
FIG. 5 is an illustration of a common dummy insertion utility, according to some embodiments.

FIG. 5 is an example 500 of a common dummy insertion utility 504. The common dummy insertion utility 504 is generated based upon one or more DRC rule sets 502, such the first DRC rule set 302, the second DRC rule set 304, and the DRC rule set 306 of FIG. 3. The common dummy insertion utility 504 comprises one or more dummy fill rules 506 used to insert one or more dummy polygons into a design layout. For example, the common dummy insertion utility 504 comprises a dummy spacing constraint 508 having a dummy spacing constraint value of 1.2 derived from the second DRC rule set 304. The common dummy insertion utility 504 comprises a dummy size constraint 510 having a dummy size constraint value of 1.5 derived from the DRC rule set 306. The dummy spacing constraint value of 1.2 and dummy size constraint value of 1.5 are used because such constraint values are relatively more restrictive than corresponding constraint values in other DRC rule sets. In some embodiments, the common dummy insertion utility 504 comprises one or more other constraints 512.

Figure 6:
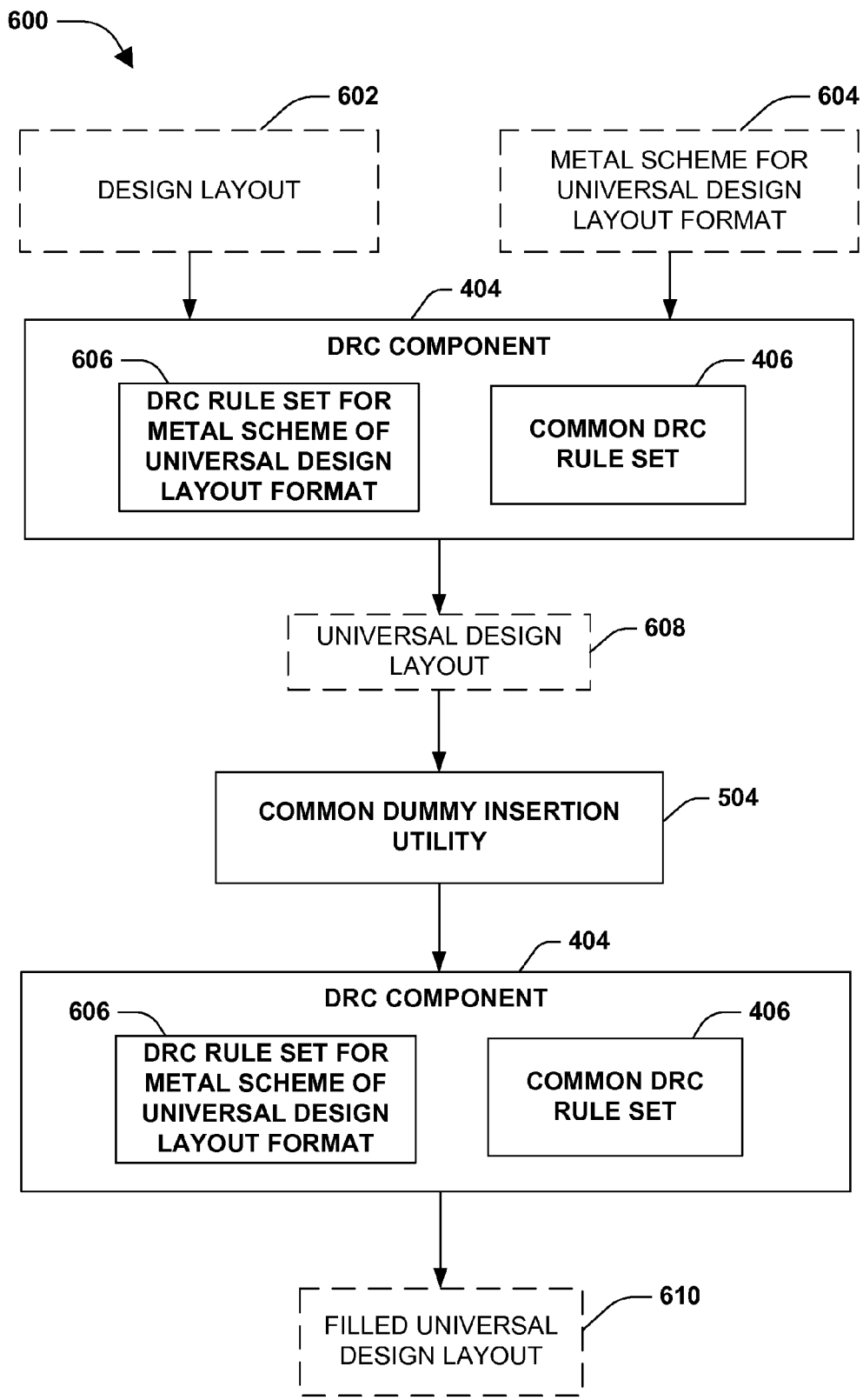
FIG. 6 is an illustration of a system configured for generating a filled universal design layout based upon a design layout.

FIG. 6 is an example of a system 600 configured for generating a filled universal design layout 610 based upon a design layout 602. The system 600 comprises a DRC component 404. The DRC component 404 is configured to maintain a common DRC rule set 406 and/or a DRC rule set 606 for a metal scheme 604 of a universal design layout format. The DRC component 404 is configured to evaluate the design layout 602 utilizing the DRC rule set 606 and/or the common DRC rule set 406 to create a universal design layout 608 that is compliant with the common DRC rule set 406 and the DRC rule set 606 for the metal scheme 604. The system 600 comprises a common dummy insertion utility 504. The common dummy insertion utility 504 is configured to insert one or more dummy polygons into the universal design layout 608 to create the filled universal design layout 610. In some embodiments, the DRC component 404 is configured to verify that the filled universal design layout 610 complies with the DRC rule set 606 and/or the common DRC rule set 406.

Figure 7:
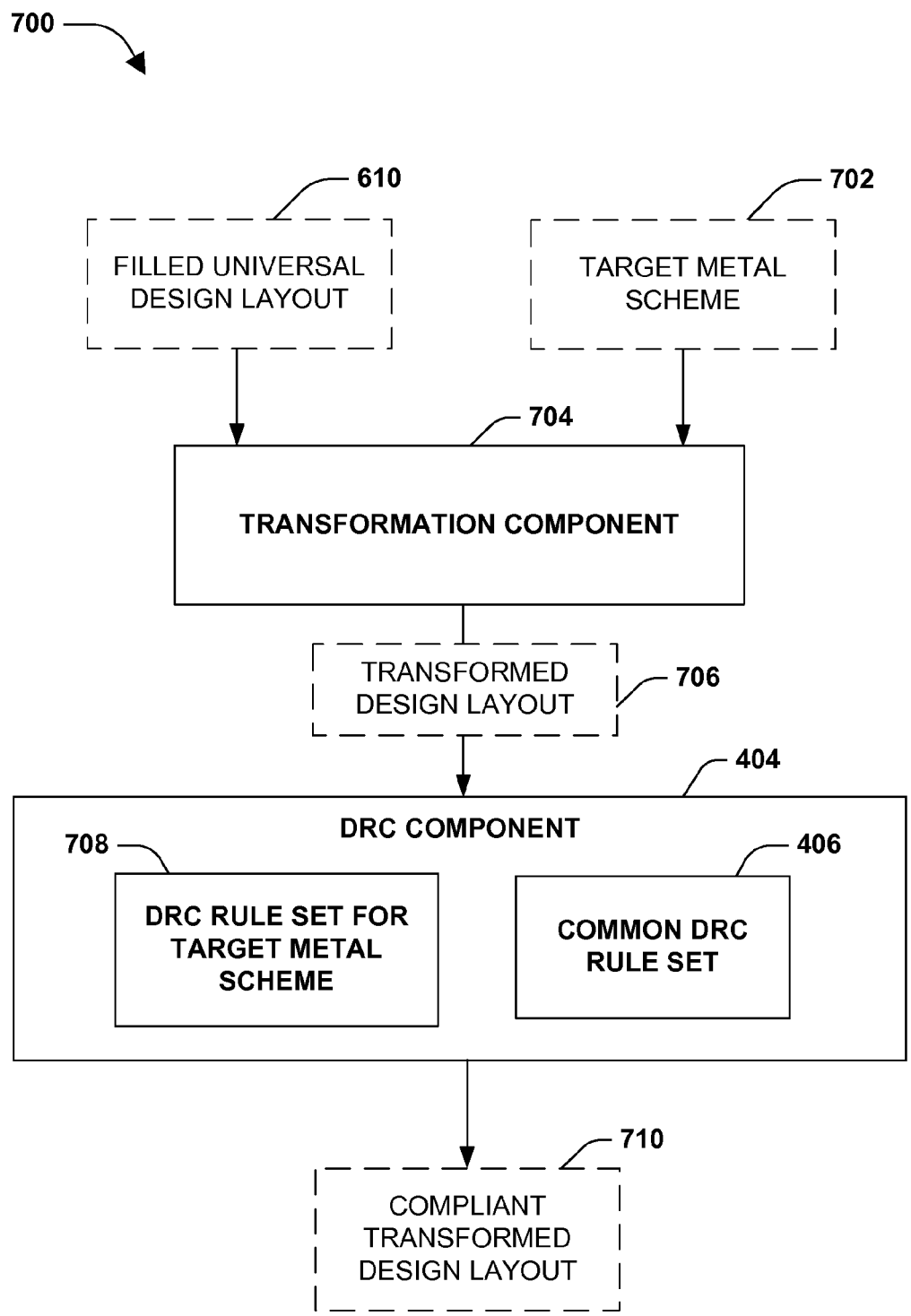
FIG. 7 is an illustration of a system configured for transforming a filled universal design layout into a transformed design layout, according to some embodiments.

FIG. 7 is an example of a system 700 configured for transforming a filled universal design layout 610 into a transformed design layout 706. The system 700 comprises a transformation component 704. In some embodiments, the filled universal design layout 610 was verified by a DRC component 404 as complying with a common DRC rule set 406 and/or a DRC rule set 606 for a metal scheme 604 of a universal design layout format, as illustrated in FIG. 6. The transformation component 704 is configured to transform the filled universal design layout 610 from a universal design layout format to a target layout format of a target metal scheme 702. In this way, the transformation component 704 generates the transformed design layout 706. The transformed design layout 706 comprises one or more metal layers, where a metal layer comprises one or more metal polygons and/or one or more dummy polygons sized and arranged according to the target metal scheme 702. The DRC component 404 is configured to verify that the transformed design layout 706 complies with a DRC rule set 708 for the target metal scheme 702 and/or the common DRC rule set 406, thus resulting in a compliant transformed design layout 710.

According to an aspect of the instant disclosure, a method for generating a common design rule check (DRC) rule set for verification of a design layout is provided. The method comprises generating a common DRC rule set comprising a set of design rules derived from one or more DRC rule sets associated with metal schemes. For respective design rules within the set of design rules, one or more DRC rule sets are evaluated to identify a design rule constraint value for a design rule based upon the design rule constraint value corresponding to a restriction threshold. The design rule constraint value is assigned to the design rule for inclusion within the common DRC rule set.

According to an aspect of the instant disclosure, a method for generating a common dummy insertion utility for verification of a design layout is provided. The method comprises evaluating one or more DRC rule sets to identify a set of constraints. In one example, a dummy size constraint value for a dummy size constraint is identified based upon the dummy size constraint value correspond to a dummy size restriction threshold. In another example, a dummy spacing constraint value for a dummy spacing constraint is identified based upon the dummy spacing constraint value corresponding to a dummy spacing restriction threshold. The common dummy insertion utility is generated based upon the set of constraints, such as the dummy size constraint having the dummy size constraint value, the dummy spacing constraint having the dummy spacing constraint value, and/or other constraints.

According to an aspect of the instant disclosure, a system for verifying a design layout is provided. The system comprises a DRC component configured to maintain a common DRC rule set derived from one or more DRC rule sets associated with metal schemes. The DRC component is configured to verify that a design layout is compliant with the common DRC rule set. The system comprises a common dummy insertion utility configured to maintain a set of constraints, such as a dummy size constraint, a dummy spacing constraint, and/or other constraints. The common dummy insertion utility is configured to fill the design layout with one or more dummy polygons based upon the set of constraints to create a filled design layout. The DRC component is configured to verify that the filled design layout is compliant with the common DRC rule set.

Figure 8:
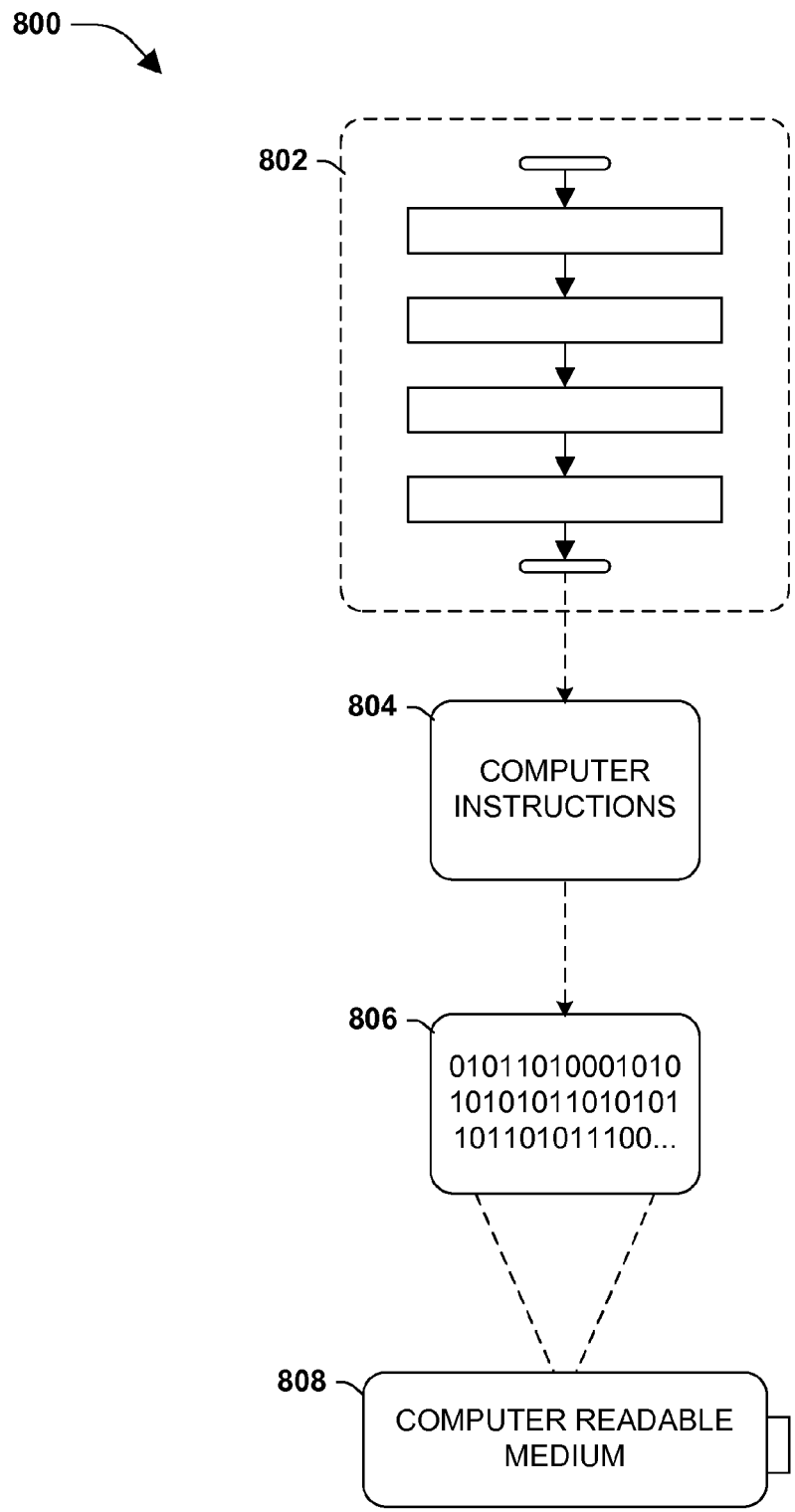
FIG. 8 is an illustration of an example computer-readable medium wherein processor-executable instructions configured to embody one or more of the provisions set forth herein may be comprised.

Still another embodiment involves a computer-readable medium comprising processor-executable instructions configured to implement one or more of the techniques presented herein. An example embodiment of a computer-readable medium or a computer-readable device that is devised in these ways is illustrated in FIG. 8, wherein the implementation 800 comprises a computer-readable medium 808, such as a CD-R, DVD-R, flash drive, a platter of a hard disk drive, etc., on which is encoded computer-readable data 806. This computer-readable data 806, such as binary data comprising at least one of a zero or a one, in turn comprises a set of computer instructions 804 configured to operate according to one or more of the principles set forth herein. In some embodiments, the processor-executable computer instructions 804 are configured to perform a method 802, such as at least some of the exemplary method 100 of FIG. 1, and/or at least some of the exemplary method 200 of FIG. 2 for example. In some embodiments, the processor-executable instructions 804 are configured to implement a system, such as at least some of the exemplary system 400 of FIG. 4, at least some of the exemplary system 600 of FIG. 6, and/or at least some of the exemplary system 700 of FIG. 7, for example. Many such computer-readable media are devised by those of ordinary skill in the art that are configured to operate in accordance with the techniques presented herein.

As used in this application, the terms "component", "module," "system", "interface", and the like are generally intended to refer to a computer-related entity, either hardware, a combination of hardware and software, software, or software in execution. For example, a component includes a process running on a processor, a processor, an object, an executable, a thread of execution, a program, or a computer. By way of illustration, both an application running on a controller and the controller can be a component. One or more components residing within a process or thread of execution and a component is localized on one computer or distributed between two or more computers.

Furthermore, the claimed subject matter is implemented as a method, apparatus, or article of manufacture using standard programming or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 9:
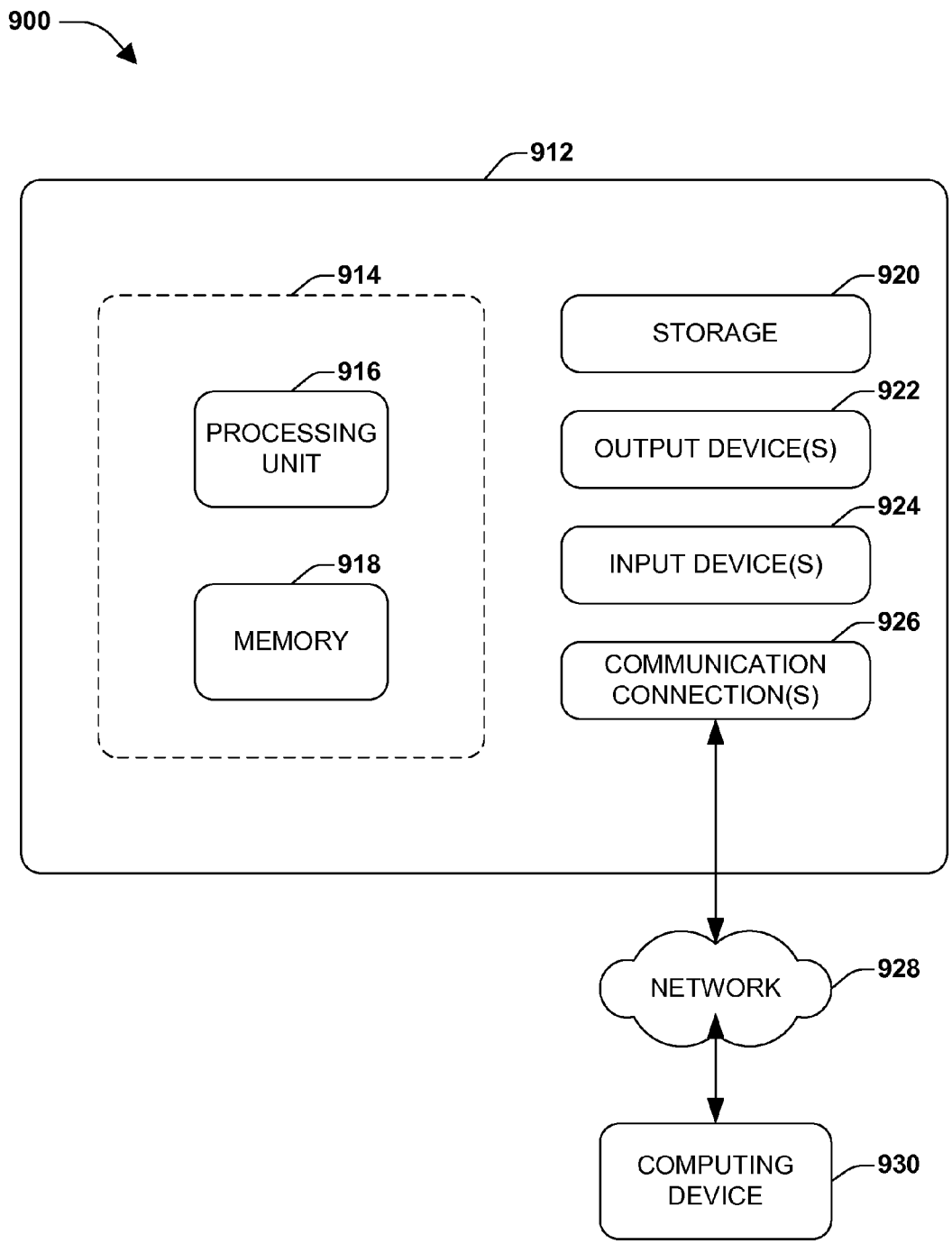
FIG. 9 illustrates an example computing environment wherein one or more of the provisions set forth herein may be implemented.

FIG. 9 and the following discussion provide a brief, general description of a suitable computing environment to implement embodiments of one or more of the provisions set forth herein. The operating environment of FIG. 9 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Generally, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 9 illustrates an example of a system 900 comprising a computing device 912 configured to implement one or more embodiments provided herein. In one configuration, computing device 912 includes at least one processing unit 916 and memory 918. In some embodiments, depending on the exact configuration and type of computing device, memory 918 is volatile, such as RAM, non-volatile, such as ROM, flash memory, etc., or some combination of the two. This configuration is illustrated in FIG. 9 by dashed line 914.

In other embodiments, device 912 includes additional features or functionality. For example, device 912 also includes additional storage such as removable storage or non-removable storage, including, but not limited to, magnetic storage, optical storage, and the like. Such additional storage is illustrated in FIG. 9 by storage 920. In some embodiments, computer readable instructions to implement one or more embodiments provided herein are in storage 920. Storage 920 also stores other computer readable instructions to implement an operating system, an application program, and the like. Computer readable instructions are loaded in memory 918 for execution by processing unit 916, for example.

The term "computer readable media" as used herein includes computer storage media. Computer storage media includes volatile and nonvolatile, removable and non-removable media implemented in any method or technology for storage of information such as computer readable instructions or other data. Memory 918 and storage 920 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 912. Any such computer storage media is part of device 912.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 912 includes input device(s) 924 such as keyboard, mouse, pen, voice input device, touch input device, infrared cameras, video input devices, or any other input device. Output device(s) 922 such as one or more displays, speakers, printers, or any other output device are also included in device 912. Input device(s) 924 and output device(s) 922 are connected to device 912 via a wired connection, wireless connection, or any combination thereof. In some embodiments, an input device or an output device from another computing device are used as input device(s) 924 or output device(s) 922 for computing device 912. Device 912 also includes communication connection(s) 926 to facilitate communications with one or more other devices.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A method for generating a common design rule check (DRC) rule set for verification of a design layout, comprising:
generating a common DRC rule set comprising a set of design rules derived from two or more DRC rule sets, a first DRC rule set of the two or more DRC rule sets associated with a first metal scheme and a second DRC rule set of the two or more DRC rule sets associated with a second metal scheme different than the first metal scheme, the generating comprising:
for respective design rules within the set of design rules:
evaluating the two or more DRC rule sets to identify a design rule constraint value for a design rule of the set of design rules based upon the design rule constraint value corresponding to a restriction threshold; and
assigning the design rule constraint value to the design rule for inclusion within the common DRC rule set, at least some of the method implemented at least in part via a processing unit.

2. The method of claim 1, comprising:
verifying that a design layout is compliant with the common DRC rule set.

3. The method of claim 1, comprising:
verifying that a design layout is compliant with the first DRC rule set associated with the first metal scheme.

4. The method of claim 1, comprising:
evaluating the two or more DRC rule sets to identify a dummy size constraint value for a dummy size constraint based upon the dummy size constraint value corresponding to a dummy size restriction threshold;
evaluating the two or more DRC rule sets to identify a dummy spacing constraint value for a dummy spacing constraint based upon the dummy spacing constraint value corresponding to a dummy spacing restriction threshold; and generating a common dummy insertion utility based upon the dummy size constraint having the dummy size constraint value and the dummy spacing constraint having the dummy spacing constraint value.

5. The method of claim 4, comprising:

inserting one or more dummy polygons into a design layout using the common dummy insertion utility to generate a filled design layout, a first dummy polygon of the one or more dummy polygons satisfying the dummy size constraint and the dummy spacing constraint.

6. The method of claim 5, comprising at least one of:

verifying that the filled design layout is compliant with the common DRC rule set; or verifying that the filled design layout is compliant with the first DRC rule set associated with the first metal scheme.

7. The method of claim 1, the restriction threshold specifying that a first design rule constraint value of the first DRC rule set is to be selected as the design rule constraint value for the design rule of the set of design rules over a second design rule constraint value of the second DRC rule set based upon the first design rule constraint value being more restrictive than the second design rule constraint value.

8. The method of claim 4, the dummy size restriction threshold specifying that a first dummy size constraint value of the first DRC rule set is to be selected as the dummy size constraint value over a second dummy size constraint value of the second DRC rule set based upon the first dummy size constraint value being more restrictive than the second dummy size constraint value.

9. The method of claim 4, the dummy spacing restriction threshold specifying that a first dummy spacing constraint value of the first DRC rule set is to be selected as the dummy spacing constraint value over a second dummy spacing constraint value of the second DRC rule set based upon the first dummy spacing constraint value being more restrictive than the second dummy spacing constraint value.

10. The method of claim 1, comprising:

generating a universal design layout based upon a design layout and a metal scheme for a universal design layout format;

verifying that the universal design layout is compliant with the common DRC rule set and a DRC rule set for the metal scheme for the universal design layout format; and inserting one or more dummy polygons into the universal design layout to create a filled universal design layout.

11. The method of claim 10, comprising:

transforming the filled universal design layout into a transformed design layout according to a target metal scheme; and verifying that the transformed design layout is compliant with the common DRC rule set and a DRC rule set for the target metal scheme.

12. The method of claim 11, comprising:

simulating the transformed design layout, the simulating comprising at least one of RC extraction, electro-migration (EM) analysis, or voltage (IR) drop analysis.

13. A method for generating a common dummy insertion utility for design layout processing, comprising:

evaluating two or more DRC rule sets to identify a set of constraints for a common DRC rule set, the evaluating comprising:

evaluating the two or more DRC rule sets to identify a dummy size constraint value for a dummy size constraint based upon the dummy size constraint value corresponding to a dummy size restriction threshold; and evaluating the two or more DRC rule sets to identify a dummy spacing constraint value for a dummy spacing constraint based upon the dummy spacing constraint value corresponding to a dummy spacing restriction threshold; and generating a common dummy insertion utility based upon the set of constraint, at least some of the method implemented at least in part via a processing unit.

14. The method of claim 13, comprising:

inserting one or more dummy polygons into a design layout using the common dummy insertion utility to generate a filled design layout, a first dummy polygon of the one or more dummy polygons satisfying the dummy size constraint and the dummy spacing constraint.

15. The method of claim 14, comprising at least one of:

verifying that the filled design layout is compliant with the common DRC rule set; or verifying that the filled design layout is compliant with a first DRC rule set of the two or more DRC rule sets and associated with a first metal scheme assigned for the design layout.

16. The method of claim 13, the dummy size restriction threshold specifying that a first dummy size constraint value of a first DRC rule set of the two or more DRC rule sets is to be selected over a second dummy size constraint value of a second DRC rule set of the two or more DRC rule sets based upon the first dummy size constraint value being more restrictive than the second dummy size constraint value.

17. The method of claim 13, the dummy spacing restriction threshold specifying that a first dummy spacing constraint value of a first DRC rule set of the two or more DRC rule sets is to be selected over a second dummy spacing constraint value of a second DRC rule set of the two or more DRC rule sets based upon the first dummy spacing constraint value being more restrictive than the second dummy spacing constraint value.

18. A system for verifying a design layout, comprising:

a DRC component configured to:

maintain a common DRC rule set derived from two or more DRC rule sets, a first DRC rule set of the two or more DRC rule sets associated with a first metal scheme and a second DRC rule set of the two or more DRC rule sets associated with a second metal scheme different than the first metal scheme; and verify that at least one of a design layout or a filled design layout is compliant with the common DRC rule set; and a common dummy insertion utility configured to:

maintain a set of constraints, the set of constraints comprising a dummy size constraint and a dummy spacing constraint; and fill the design layout with one or more polygons based upon the set of constraints to create the filled design layout.

19. The system of claim 18, the common dummy insertion utility configured to:

evaluate the two or more DRC rule sets to identify a dummy size constraint value for the dummy size constraint based upon the dummy size constraint value corresponding to a dummy size restriction threshold; and evaluate the two or more DRC rule sets to identify a dummy spacing constraint value for the dummy spacing constraint based upon the dummy spacing constraint value corresponding to a dummy spacing restriction threshold.

20. The system of claim 18, the common DRC rule set comprising a set of design rules, and the DRC component configured to:

for respective design rules within a set of design rules:
evaluate the two or more DRC rule sets to identify a design rule constraint value for a design rule of the set of design rules based upon the design rule constraint value corresponding to a restriction threshold; and
assign the design rule constraint value to the design rule within the common DRC rule set.

\* \* \* \* \*